United States Patent
Kang et al.

(10) Patent No.: US 8,299,470 B2
(45) Date of Patent: Oct. 30, 2012

(54) FLAT DISPLAY DEVICE AND METHOD OF MANUFACTURING THE SAME

(75) Inventors: Chul-Kyu Kang, Suwon-si (KR);
Jong-Hyun Choi, Suwon-si (KR);
Woo-Sik Jun, Suwon-si (KR);
Hee-Chul Jeon, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 969 days.

(21) Appl. No.: 11/898,506

(22) Filed: Sep. 12, 2007

(65) Prior Publication Data
US 2008/0246037 A1 Oct. 9, 2008

(30) Foreign Application Priority Data
Apr. 6, 2007 (KR) .................. 10-2007-0034400

(51) Int. Cl.
*H01L 33/00* (2010.01)
*H01L 21/00* (2006.01)

(52) U.S. Cl. ............. 257/72; 257/43; 257/347; 257/59; 257/E27.06; 257/E51.006

(58) Field of Classification Search .......... 257/72, 257/43, 347, 59, E27.06, E51.006
See application file for complete search history.

(56) References Cited

U.S. PATENT DOCUMENTS

| 2002/0074549 A1* | 6/2002 | Park et al. .......... 257/59 |
| 2007/0019123 A1* | 1/2007 | Seo et al. .......... 349/43 |
| 2009/0186437 A1 | 7/2009 | Akimoto |
| 2010/0197085 A1* | 8/2010 | Ahn et al. .......... 438/158 |
| 2010/0320469 A1* | 12/2010 | Park .......... 257/59 |

FOREIGN PATENT DOCUMENTS

| KR | 10-2003-0058511 | 7/2003 |
| KR | 10-2005-0104955 | 11/2005 |

OTHER PUBLICATIONS

Office Action from the Korean Patent Office issued in Applicant's corresponding Korean Patent Application No. 2007-0034400 dated Feb. 29, 2008.

* cited by examiner

*Primary Examiner* — Cuong Q Nguyen
*Assistant Examiner* — Cathy N Lam
(74) *Attorney, Agent, or Firm* — Robert E. Bushnell, Esq.

(57) ABSTRACT

Provided is a flat display device, and more particularly, an active matrix (AM) flat display device having a thin film transistor (TFT). The flat display device includes a substrate, a plurality of TFTs (thin film transistors) provided on the substrate, each TFT comprising an active layer, a source electrode and a drain electrode that contact the active layer, and an ohmic contact layer interposed between the active layer and the source and drain electrodes, and a light emitting device electrically connected to the TFT, wherein the ohmic contact layer and a layer including the source and drain electrodes are formed to have the same pattern.

15 Claims, 6 Drawing Sheets

FIG. 6H

FLAT DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for FLAT DISPLAY DEVICE AND METHOD OF MANUFACTURING THE SAME earlier filed in the Korean Intellectual Property Office on 6 Apr. 2007 and there duly assigned Serial No. 10-2007-0034400.

BACKGROUND OF THE INVENTION

1. Field of the Invention

The present invention relates to a flat display device, and more particularly, to an active matrix (AM) flat display device having a thin film transistor (TFT).

2. Description of the Related Art

Flat display devices such as liquid crystal displays (LCDs), organic light emitting displays (OLEDs) or inorganic light emitting displays are divided into passive matrix (PM) flat display devices and active matrix (AM) flat display devices according to driving methods.

In PM flat display devices, anodes and cathodes are arranged in a plurality of columns and a plurality of rows, scanning signals are supplied to the cathodes from a row driving circuit, and in this case, only one row is selected from the plurality of rows. In addition, a data signal is input to each pixel by using a column driving circuit.

Meanwhile, AM flat display devices have been widely used as display devices which control a signal input to each pixel using a thin film transistor (TFT), and are appropriate for processing an enormous amount of signals and realizing moving images.

TFTs of AM flat display devices comprise a semiconductor active layer having source and drain regions doped with high-concentration impurities on a substrate and on a channel region formed between the source and drain regions, a gate electrode facing the active region of the semiconductor active layer, a gate insulating layer interposed between the semiconductor active layer and the gate electrode, and source and drain electrodes respectively contacting the source and drain regions of the semiconductor active layer.

SUMMARY OF THE INVENTION

The present invention provides a flat display device which simplifies a manufacturing process, reduces manufacturing costs and improves process yield by minimizing the number of masks used in manufacturing a flat display device and a method of manufacturing the same.

According to an aspect of the present invention, there is provided a flat display device, the flat display device comprising: a substrate; a plurality of TFTs (thin film transistor) provided on the substrate, each TFT comprising an active layer, a source electrode and a drain electrode that contact the active layer, and an ohmic contact layer interposed between the active layer and the source and drain electrodes; and a light emitting device electrically connected to the TFT, wherein the ohmic contact layer and a layer including the source and drain electrodes are formed to have the same pattern.

The flat display device may further comprise a pixel electrode formed by extending one of the source electrode and the drain electrode.

The pixel electrode may be formed by patterning the ohmic contact layer and the layer including the source and drain electrodes.

The TFT may further comprise a semiconductor active layer that contacts the ohmic contact layer.

A portion of the ohmic contact layer formed between the source electrode and the drain electrode may be opened so that part of the semiconductor active layer can be exposed to the outside.

The TFT may further comprise a gate electrode formed on the substrate and a gate insulating layer interposed between the gate electrode and the source and drain electrodes.

The flat display device may further comprise a pixel defining layer which is formed on the TFT and in which an opening for defining a pixel region is formed.

According to another aspect of the present invention, there is provided a method of manufacturing a flat display device, the method comprising: patterning a gate electrode on a substrate using a first mask; patterning a source electrode and a drain electrode on the gate electrode using a second mask; and patterning a PDL (pixel defining layer) on the source electrode and the drain electrode using a third mask.

The patterning of the source electrode and the drain electrode may comprise: forming an ohmic contact layer doped with impurities on the gate electrode; depositing a metallic layer on the ohmic contact layer; and patterning the ohmic contact layer and the metallic layer.

The ohmic contact layer and the metallic layer may be patterned to have the same shape.

A pixel electrode may be formed simultaneously with the source electrode and the drain electrode by patterning the ohmic contact layer and the metallic layer.

Between the patterning of the gate electrode and the patterning of the source electrode and the drain electrode, the method may further comprise forming a gate insulating layer on the gate electrode and forming a semiconductor active layer on the gate insulating layer.

The patterning of the source electrode and the drain electrode may be performed by a half-tone exposure process.

The half-tone exposure process may be performed using a photomask in which a light transmitting region, a light shielding region, and a semi-transmitting region are formed on a light transmitting substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
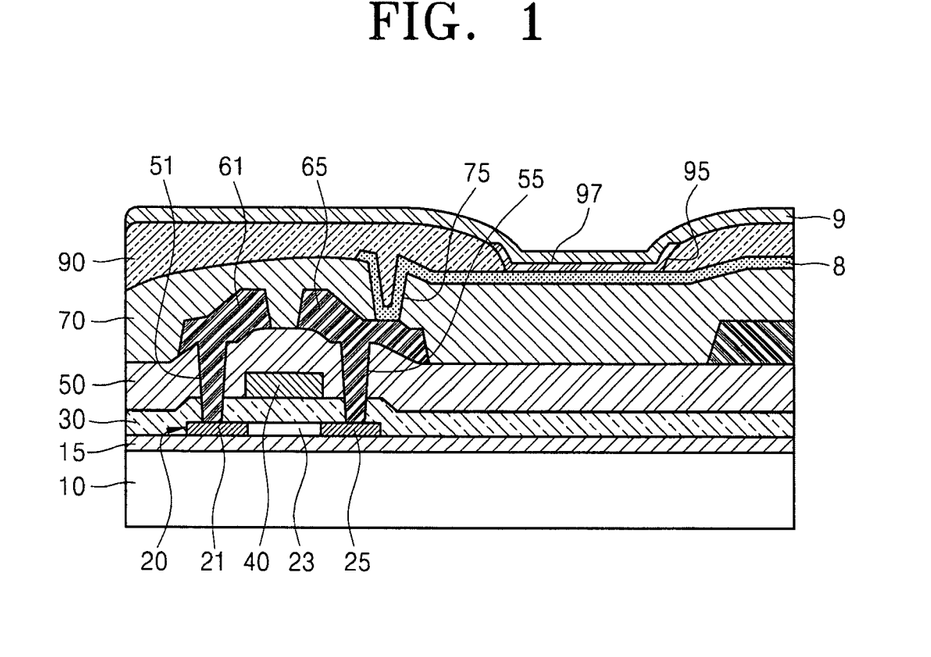
FIG. 1 is a cross-sectional view of an active matrix organic light emitting display (AMOLED) having a thin film transistor (TFT)

FIG. 1 is a cross-sectional view of an active matrix organic light emitting display (AMOLED).

Referring to FIG. 1, firstly, a buffer layer 15 is formed on an insulating substrate 10. Amorphous silicon is deposited on the buffer layer 15 and is crystallized to form a polysilicon layer. Then, the polysilicon layer is patterned using a first mask to form an active layer 20. After that, a gate insulating layer 30 is deposited on the active layer 20 and on the entire surface of the insulating substrate 10.

A gate metal is deposited on the gate insulating layer 30 and is patterned using a second mask, thereby forming a gate electrode 40 on the gate insulating layer 30 above the active layer 20. Impurities of a predetermined conductivity type are doped using the gate electrode 40 as a mask, thereby forming a source region 21 and a drain region 25. A region between the source region 21 and the drain region 25 which is not doped acts as a channel region 23.

An interlevel dielectric layer 50 is formed by depositing an oxide layer on the entire surface of the foregoing layers/components formed on the insulating substrate 10, and contact holes 51 and through which part of the source region 21 and the drain region 25 are exposed are formed by etching the interlevel dielectric layer 50 using a third mask.

After a conductive material is deposed on the interlevel dielectric layer 50 having the contact holes 51 and 55, a source electrode 61 connected to the source region 21 through the contact hole 51 and a drain electrode 65 connected to the drain region 25 through the contact hole 55 are formed by patterning the interlevel dielectric layer 50 using a fourth mask.

A protective layer 70 is deposited on the entire surface of the foregoing layers/components formed on the insulating substrate 10 in which the source electrode 61 and the drain electrode 65 are formed, and a via hole 75 through which one of the source electrode 61 or the drain electrode 65 (for this example, part of the drain electrode 65, is exposed) is formed in the protective layer 70 using a fifth mask so that a lower electrode, which will be formed later in a subsequent process, and a drain electrode can be connected to each other.

After indium tin oxide (ITO), used as the lower electrode material, is deposited on the protective layer 70 having the via hole 75, a lower electrode 80 connected to the drain electrode 65 through the via hole 75 is formed by patterning the ITO using a sixth mask.

After a planarization layer 90 is formed on the entire surface of the foregoing layers/components formed on the insulating substrate 10 in which the lower electrode 80 is formed, an opening 95 through which the lower electrode 80 is exposed is formed using a seventh mask.

Last, a light emitting layer 97 connected to the lower electrode 80 within the opening 95 is formed. In addition an upper electrode 99 is formed by depositing a conductive material on the entire surface of the foregoing layers/components formed on the insulating substrate 10 on which the light emitting layer 97 is formed.

In the method of manufacturing the above-described AMOLED, at least 7 masks are used and the number of mask processes is large. Thus manufacturing costs are high and a process yield is low.

The present invention will now be described more fully with reference to the accompanying drawings, in which exemplary embodiments of the invention are shown.

Figure 2:
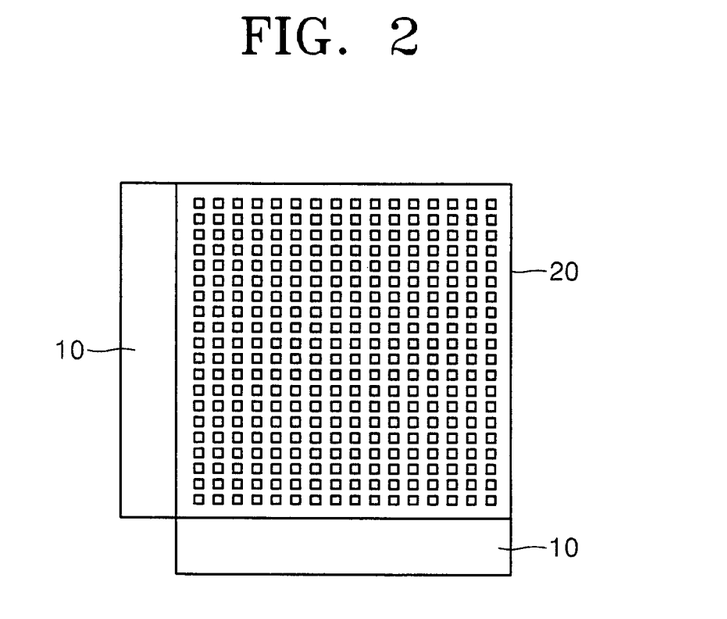
FIG. 2 is a plan view of an AMOLED including a plurality of TFTs according to an embodiment of the present invention.

FIG. 2 is a plan view of an active matrix organic light emitting display (AMOLED) having a plurality of thin film transistors (TFT) according to an embodiment of the present invention.

Referring to FIG. 2, the active matrix organic light emitting display (AMOLED) comprises a pixel region 20 and a circuit region 10 formed at an edge of the pixel region 20.

The pixel region 20 comprises a plurality pixels. Each of the pixels comprises a plurality of subpixels each having an organic light emitting device. In a full color OLED, red (R), green (G), and blue (B) subpixels are arranged in various patterns such as line-shaped patterns, mosaic-shaped patterns, and lattice-shaped patterns to constitute a pixel and a mono color flat display device (not a full color OLED) may also be used.

The pixel region 10 controls an image signal input to the pixel region 20.

In the OLED, at least one TFT unit may be installed in each of the pixel region 20 and the circuit region 10.

The TFT unit installed in the pixel region 20 includes a pixel-unit TFT comprising a switching TFT which controls its own operation by transmitting a data signal to a light emitting device in response to a signal of a gate line, and a driving TFT which drives an organic light emitting device so that a predetermined current flows through the organic light emitting device in response to the data signal, and a circuit-unit TFT to implement a predetermined circuit.

The number and arrangement of TFTs may be changed according to the characteristics of a display and a driving method applied thereto, and there may be various methods of arranging TFTs.

Each of the TFTs comprises an active layer formed of amorphous or polycrystalline silicon. The active layer has a predetermined channel region. The channel region is positioned in the middle of a source region and a drain region.

Figure 3:
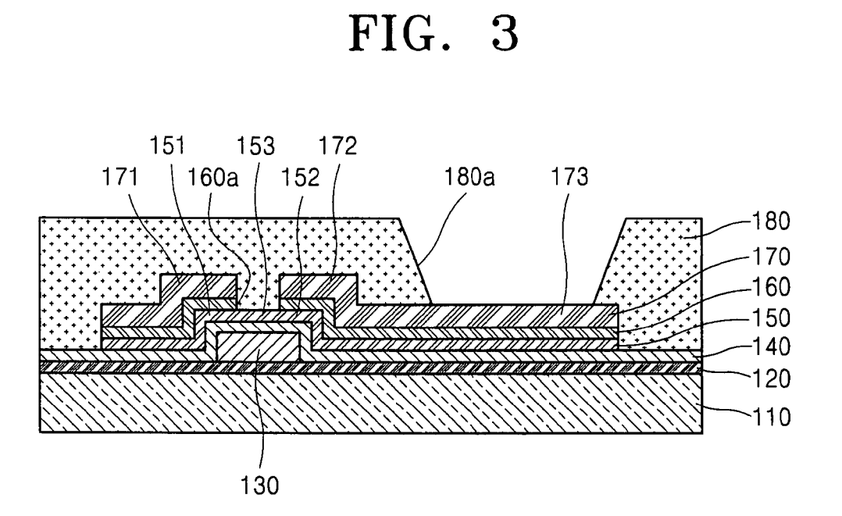
FIG. 3 is a cross-sectional view illustrating the structure of a TFT included in the AMOLED of FIG. 2.

FIG. 3 is a cross-sectional view illustrating the structure of a TFT included in the AMOLED of FIG. 2.

Referring to FIG. 3, a TFT 100 according to an embodiment of the present invention may be disposed on a substrate 110. A buffer layer 120 is deposited on the substrate 110, a gate electrode 130 is formed on the buffer layer 120, and a gate insulating layer 140 is formed to cover the gate electrode 130 and exposed buffer layer 120.

A semiconductor active layer 150 formed of a semiconductor material and having source, drain, and channel regions 151, 152, and 153 is formed on the gate insulating layer 140, and an ohmic contact layer 160 doped with impurities is formed on the semiconductor active layer 150.

A source electrode 171 and a drain electrode 172 are formed from a source/drain metallic layer 170 is deposited on the ohmic contact layer 160. An opening 160*a* is formed in the ohmic contact layer 160 and the semiconductor active layer 150 exposing channel region 153. A pixel defining layer 180 is formed on the source electrode 171 and the drain electrode 172. An opening 180*a* is formed in pixel defining layer 180 exposing a pixel electrode 173.

In detail, the substrate 110 may be a substrate formed of glass or a substrate formed of plastics. When the substrate 110 is formed of plastics, materials such as acryl, polyethylene, polypropylene, polyimide, polycarbonate, polyester, polyurethane, polystyrene, polyacetyl, mylar or other plastic materials may be used. A barrier layer having a structure in which an inorganic layer and/or an organic layer are stacked to have a single or composite shape may be coated on the surface of the substrate 110, and an antioxidant may also be coated on the surface of the substrate 110.

The buffer layer 120 is formed on the substrate 110 formed of an insulating material. The buffer layer 120 may be formed of an insulating material such as SiO2 and may be deposited using a method such as chemical vapor deposition (CVD), plasma enhanced (PE) CVD, low pressure (LP) CVD or electron cyclotron resonance (ECR) CVD. The buffer layer 120 may be deposited to a thickness of approximately 3000 Å.

A gate electrode 130 is formed as a conductive metallic layer such as Mo (Molybdenum), MoW (Molybdenum-Tungsten), Al (Aluminum), Cr (Chrome), and Al/Cu (Aluminum/Copper) or the like in a predetermined region of the buffer layer 120.

The gate electrode 130 is formed by depositing a gate metallic layer in a predetermined region of the buffer layer 120 and then performing a first photolithography process. That is, the gate electrode 130 is formed by patterning the gate metallic layer.

A gate insulating layer 140 is formed on the gate electrode 130 to cover the gate electrode 130. The gate insulating layer 140 may be formed of an inorganic insulating layer such as $SiO_2$, $SiN_x$, $Al_2O_3$, $Ta_2O_5$, BST, and PZT using a method such as CVD, PE CVD, LP CVD, ECR CVD or sputtering. Alternatively, the gate insulating layer 140 may be formed of an organic insulating layer formed of a polymer material such as poly methylmethacrylate (PMMA) which is a commonly-used polymer, polystyrene, phenol-based polymer, acryl-based polymer, imide-based polymer such as polyimide, arylene ether-based polymer, amide-based polymer, fluorine-based polymer, p-xylene-based polymer, vinylalcohol-based polymer, parylene, and a compound including at least one thereof. As occasion demands, the gate insulating layer 140 may be formed in a plurality of layers and may be formed in various shapes.

Amorphous silicon (a-Si) is deposited on the gate insulating layer 140 and is crystallized, thereby forming polycrystalline silicon (poly-Si) so that a semiconductor active layer 150 can be formed. The semiconductor active layer 150 comprises a source region 151 and a drain region 152, and a channel region 153 interposed between the source region 151 and the drain region 152.

In detail, in an amorphous silicon (a-Si) TFT used in a flat display device, such as a liquid crystal display (LCD), an organic light emitting display (OLED) or an inorganic light emitting display, the semiconductor active layer constituting the source, drain, and channel regions 151, 152, and 153 is formed of amorphous silicon. However, an a-Si TFT has low electron mobility less than $cm^2/Vs$. As such, recently, a-Si TFTs have been replaced with poly-Si TFTs. The poly-Si TFT has higher electron mobility compared to the a-Si TFT and stability for radiation of light is excellent. Thus, the poly-Si TFT may be used as a driving and/or switching TFT of an AMLCD or an AMOLED.

Such poly-Si can be manufactured using various methods. The methods can be largely divided into two methods; one is a method of directly depositing poly-Si and the other one is a method of depositing and crystallizing a-Si.

The method of directly depositing poly-Si includes CVD, photo CVD, hydrogen radical (HR) CVD, ECR CVD, PE CVD and LP CVD.

Meanwhile, the method of depositing and crystallizing a-Si includes solid phase crystallization (SPC), excimer laser crystallization (ELC), sequential lateral solidification (SLS), metal induced crystallization (MIC), and metal induced lateral crystallization (MILC).

An ohmic contact layer 160 for ohmic contact is formed on the semiconductor active layer 150. In other words, impurities having a predetermined conductivity type are doped on the semiconductor active layer 150, thereby forming the ohmic contact layer 160.

A source/drain metallic layer 170 is deposited on the ohmic contact layer 160. Here, the source/drain metallic layer 170 may be formed of Cu, Ag, Ni, and Fe. The metallic layer 170 formed in this way is patterned by half-tone exposure using a second mask so that the source electrode 171, the drain electrode 172, and a pixel electrode 173 may be formed. An operation of forming the source electrode 171, the drain electrode 172, and the pixel electrode 173 by half-tone exposure will now be described.

A pixel defining layer (PDL) 180 is formed on the source electrode 171, the drain electrode 172, and the pixel electrode 173.

Here, an organic layer which is an insulating material may be used as a material used to form the PDL 180.

After the PDL material is formed, in order to pattern the PDL 180, a photoresist is formed on the PDL material, a third mask is disposed, UV light is radiated, an opening 180a is formed in a pixel region, and the pixel electrode 173 is exposed.

Through the above-described structure, the TFT can be manufactured using only three masks so that a manufacturing process can be simplified and manufacturing costs can be reduced.

Figure 4:
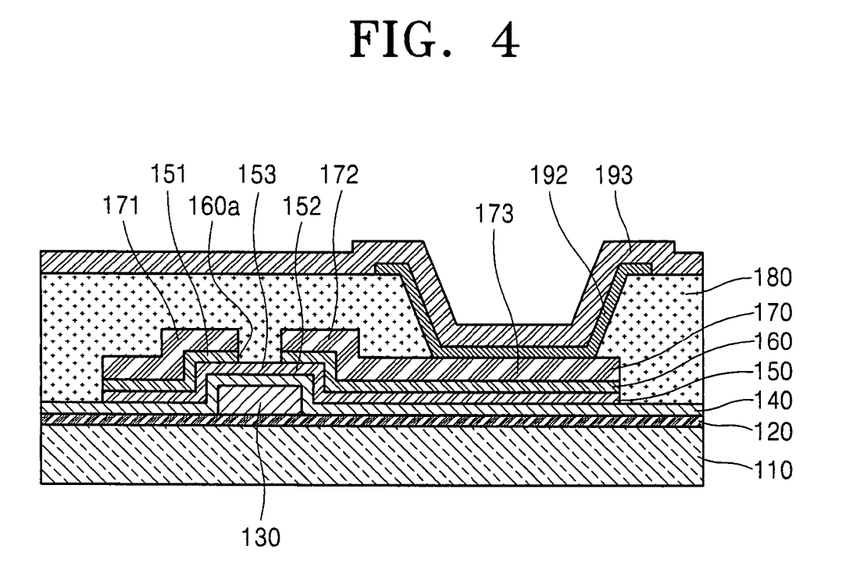
FIG. 4 is a cross-sectional view illustrating one subpixel of the AMOLED of FIG. 2.

FIG. 4 is a cross-sectional view illustrating one subpixel of the AMOLED of FIG. 2.

As illustrated in FIG. 4, the buffer layer 120 is formed on the substrate 110 formed of glass or plastics, and an OLED including a plurality of TFTs is formed on the buffer layer 120. Here, the structure of the TFT is illustrated in FIG. 3.

An organic layer 192 is formed on the PDL 180 in which a predetermined opening is formed. The organic layer 192 comprises a light emitting layer. The present invention is not limited to this, and an OLED having a variety of structures may be applied to the present invention.

Each OLED displays predetermined image information by emitting red, green, or blue light according to the flow of current. The OLED comprises a pixel electrode 173 which is connected to the drain electrode 172 of the TFT, a plus (+) voltage is supplied from the drain electrode 172, and as such it serves as an anode. A cathode electrode layer 193 is provided to cover the entire pixel and supplies a minus (−) voltage, and the organic layer 192 is disposed between the pixel cathode 173 and the cathode electrode layer 193.

The pixel electrode 173 and the cathode electrode layer 193 are insulated from each other by the organic layer 192, and voltages having different polarities are applied to the cathode electrode layer 193 and the pixel electrode 173 so that light can be emitted from the organic layer 192.

The organic layer 192 may be a low molecular weight or high molecular weight organic layer. When the organic layer 192 is a low molecular weight organic layer, the organic layer 192 may be formed by stacking a hole injection layer (HIL), a hole transport layer (HTL), an emission layer (EML), an electron transport layer (ETL), and an electron injection layer (EIL) to have a single or composite structure, and available organic materials may be copper phthalocyanine (CuPc), N,N'-Di(naphthalene-1-yl)-N,N'-diphenyl-benzidine (NPB), and tris-8-hydroxyquinoline aluminum (Alq3) or the like. These low molecular weight organic layers are formed using vapor deposition.

When the organic layer 192 is a high molecular weight organic layer, the organic layer 192 may have a structure comprising an HTL and an EML. In this case, PEDOT is used as the HTL, and poly-phenylenevinylene (PPV)- and polyfluorene-based polymer organic materials are used as the EML, and the HTL and the EML may be formed using screen printing and ink-jet printing.

The organic layer is not limited to this and various embodiments thereof may be applied.

The pixel electrode 173 serves as an anode, and the cathode electrode layer 193 serves as a cathode. However, the polarities of the pixel electrode 173 and the cathode electrode layer 193 may be the opposite.

A method of manufacturing a TFT according to an embodiment of the present invention will now be described.

Figure 5:
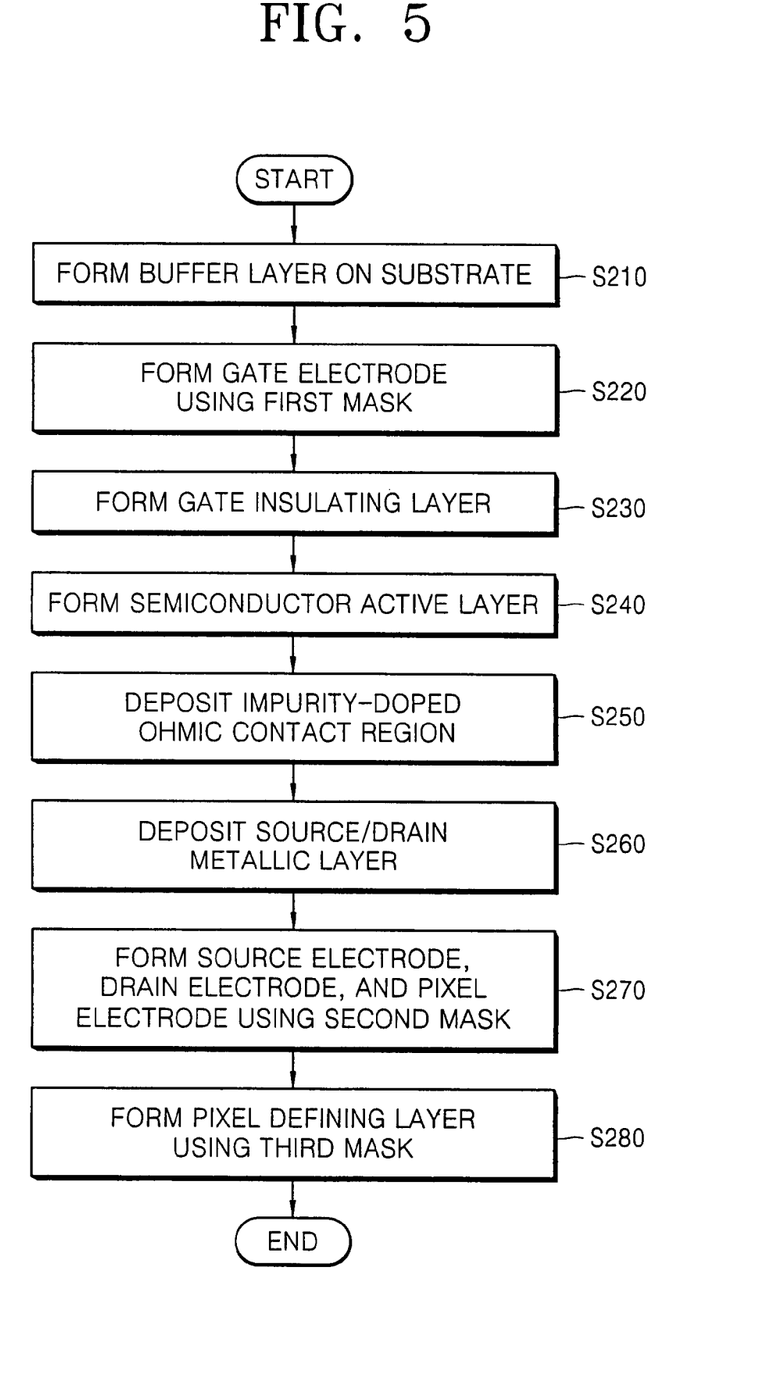
FIG. 5 is a flowchart illustrating a method of manufacturing a TFT according to an embodiment of the present invention.

FIG. 5 is a flowchart illustrating a method of manufacturing a TFT according to an embodiment of the present invention, and FIGS. 6A through 6H illustrate operations for performing the method of manufacturing a TFT of FIG. 5.

Referring to FIGS. 5 and 6, the method of manufacturing a TFT according to an embodiment of the present invention comprises forming a buffer layer on a substrate (operation S210), forming a gate electrode on the substrate using a first mask (operation S220), forming a gate insulating layer on the gate electrode (operation S230), forming a semiconductor active layer on the gate insulating layer (operation S240), depositing an ohmic contact layer doped with impurities on the semiconductor active layer (operation S250), depositing source and drain metallic layers on the ohmic contact layer (operation S260), patterning the source and drain metallic layers using a second mask to form source, drain, and pixel electrodes (operation S270), and forming a pixel defining layer using a third mask (operation S280).

Figure 6A:
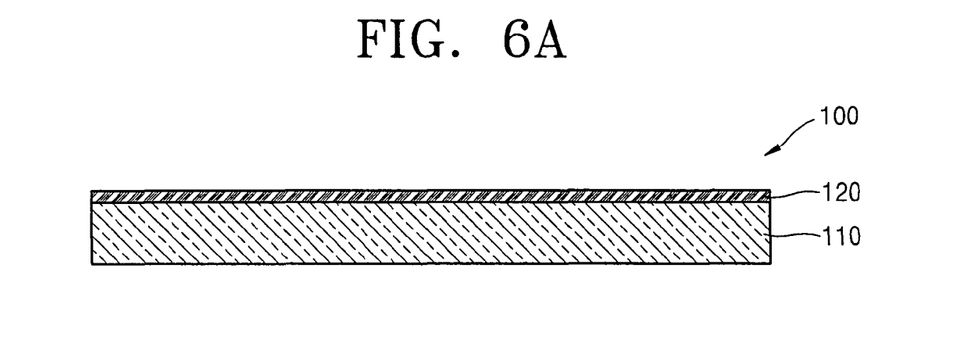
FIGS. 6A through 6H illustrate operations of performing the method of manufacturing a TFT of FIG. 5.

FIG. 6A illustrates the state where the buffer layer 120 is formed on the substrate 110 to begin forming TFT 100. Referring to FIG. 6A, the buffer layer 120 mainly formed of $SiO_2$ is formed on the substrate 110 which itself is formed of an insulating material (operation S210). The buffer layer 120 may be deposited using a method such as CVD, PE CVD, LP CVD or ECR CVD.

Figure 6B:
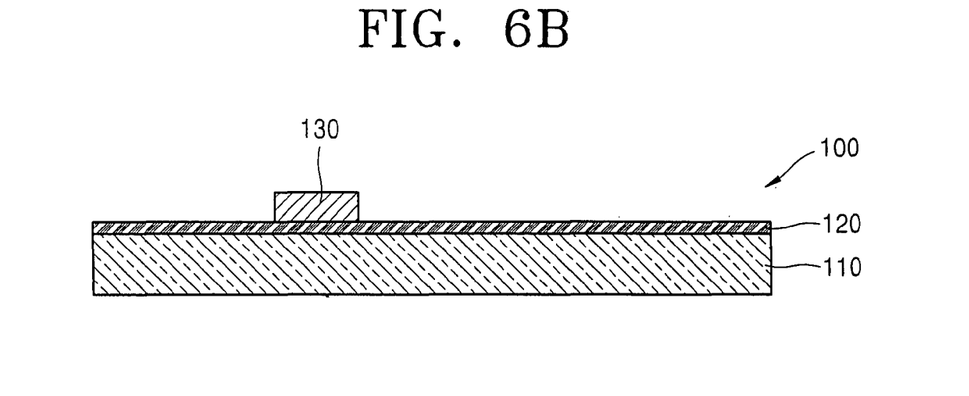

FIG. 6B illustrates an operation of forming a gate electrode 130 on a substrate 110 using a first mask (operation S220). Here, the gate electrode 130 may be directly formed on the substrate 110 or on the above-described buffer layer 120. The gate electrode 130 may be formed of a conductive metallic layer such as Mo, MoW, Al, Cr, Al/Cu or the like in a predetermined region on the substrate 110.

In detail, a gate metallic layer is deposited on a predetermined region on the buffer layer 120 and then is patterned using the first mask, thereby forming the gate electrode 130.

Figure 6C:
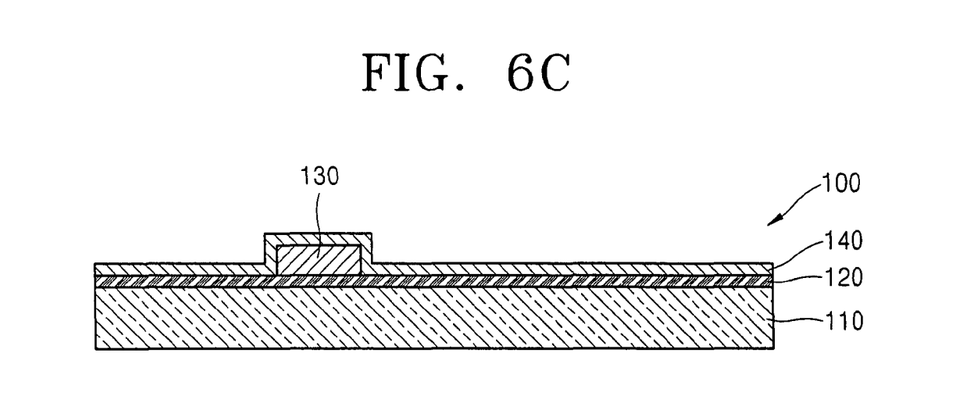

FIG. 6C illustrates an operation of forming a gate insulating layer 140 on the gate electrode 130 (operation S230). Referring to FIG. 6C, $SiO_2$ or $SiN_x$ may be used for the gate insulating layer 140 and the gate insulating layer 140 may also be formed of a double layer comprising $SiO_2$ and $SiN_x$. The gate insulating layer 140 may be deposited using a method such as CVD, PE CVD, LP CVD or ECR CVD.

Figure 6D:
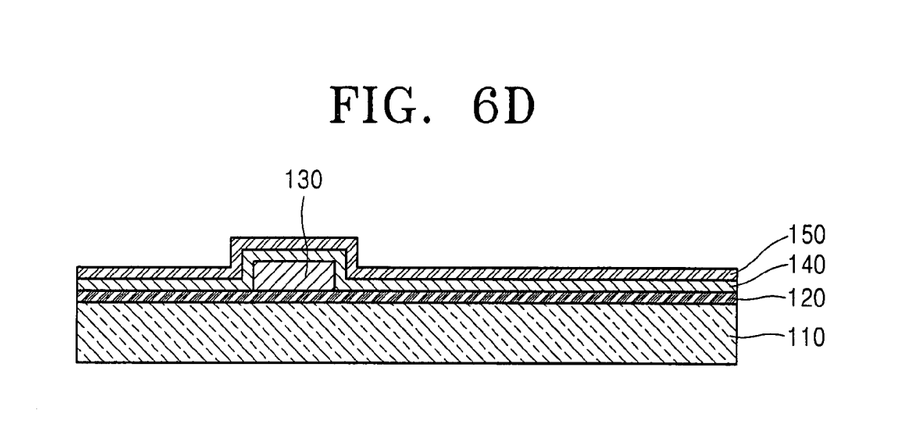

FIG. 6D illustrates an operation of forming a semiconductor active layer 150 on the gate insulating layer 140 (operation S240). The semiconductor active layer 150 is formed of polycrystalline silicon, and a method of manufacturing a polycrystalline silicon layer can be largely classified into two methods; a method of directly depositing polycrystalline silicon and a method of depositing and crystallizing amorphous silicon.

Firstly, the method of directly depositing polycrystalline silicon includes using CVD, Photo CVD, hydrogen radical (HR) CVD, ECR CVD, PE CVD or LP CVD.

Meanwhile, the method of depositing and crystallizing amorphous silicon includes using solid phase crystallization (SPC), excimer laser crystallization (ELC), sequential lateral solidification (SLS), metal induced crystallization (MIC) or metal induced lateral crystallization (MILC).

Figure 6E:
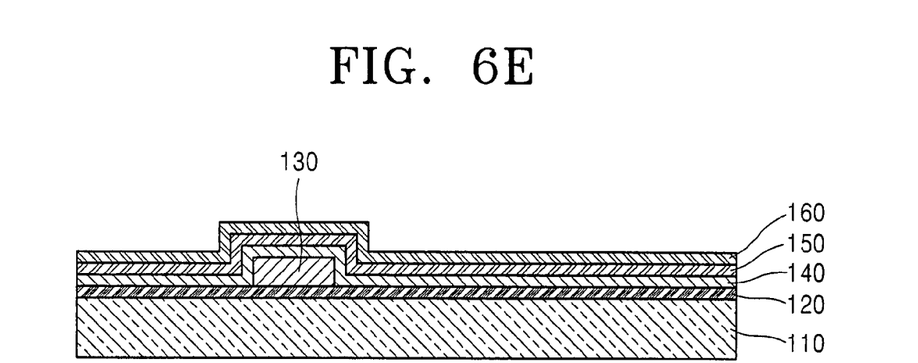

FIG. 6E illustrates an operation of forming an ohmic contact layer 160 for ohmic contact on the semiconductor active layer 150 (operation S250). Referring to FIG. 6E, in order to reduce resistance between the semiconductor active layer 150 and the source and drain electrodes 171 and 172, which are formed of different materials, impurities having a predetermined conductivity type are doped on the semiconductor active layer 150, thereby forming the ohmic contact layer 160.

Figure 6F:
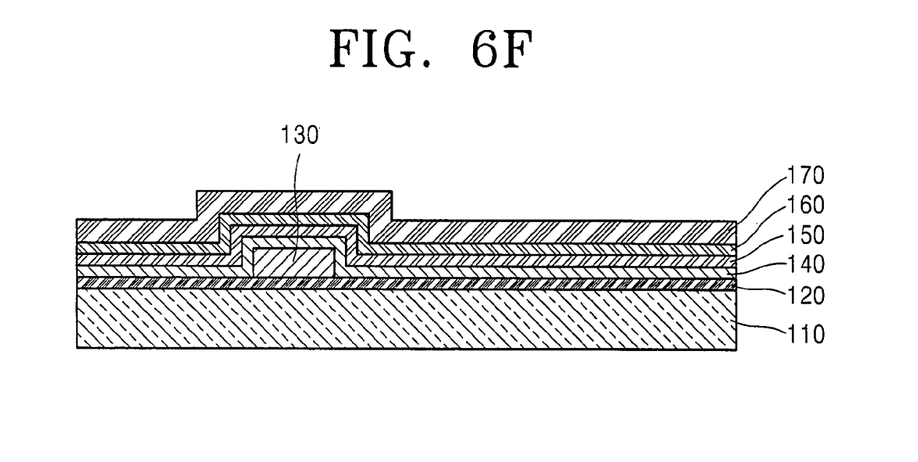
Figure 6G:
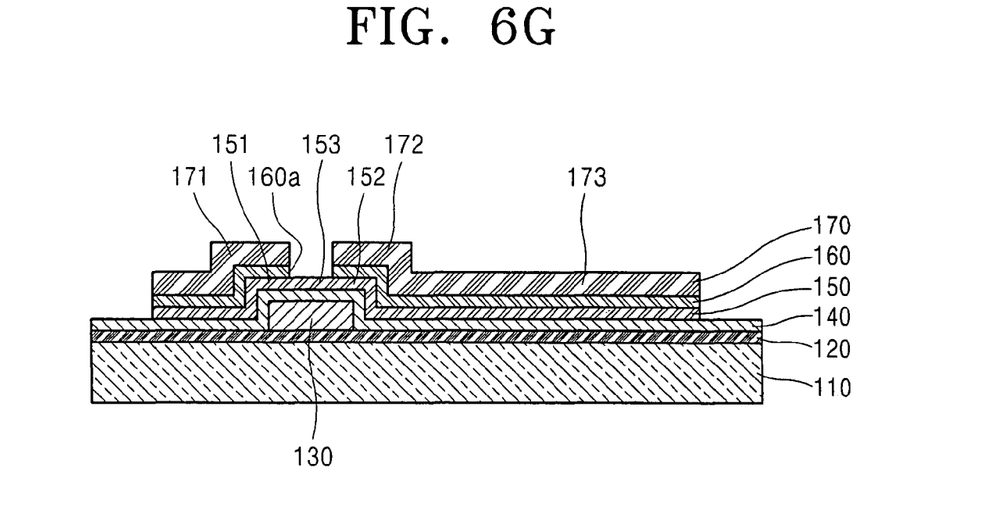

FIG. 6F illustrates an operation of depositing a source/drain metallic layer 170 on the ohmic contact layer 160 (operation S260), and FIG. 6G illustrates an operation of patterning the ohmic contact layer 160 and the source/drain metallic layer 170 using a second mask to form source, drain, and pixel electrodes 171, 172, and 173 (operation S270).

Referring to FIGS. 6F and 6G, the source/drain metallic layer 170 is deposited on the ohmic contact layer 160. Here, the source/drain metallic layer 170 may be formed of Cu, Ag, Ni, and Fe or the like.

The ohmic contact layer 160 and the metallic layer 170 stacked in this way is patterned by half-tone exposure using the second mask, thereby forming the source electrode 171, the drain electrode 172, and the pixel electrode 173. Here, half-tone exposure is a technique for performing exposure using a photomask in which a light shielding layer pattern is formed on a light transmitting substrate to define a light transmitting region and a light shielding region and an additional light shielding layer pattern is further formed to define a semi-transmitting region in which light of medium intensity can be transmitted, in addition to the light transmitting region and the light shielding region, which differs from a general photomask which is designed to only transmit or block light according to the existence of a light shielding layer.

Figure 6H:
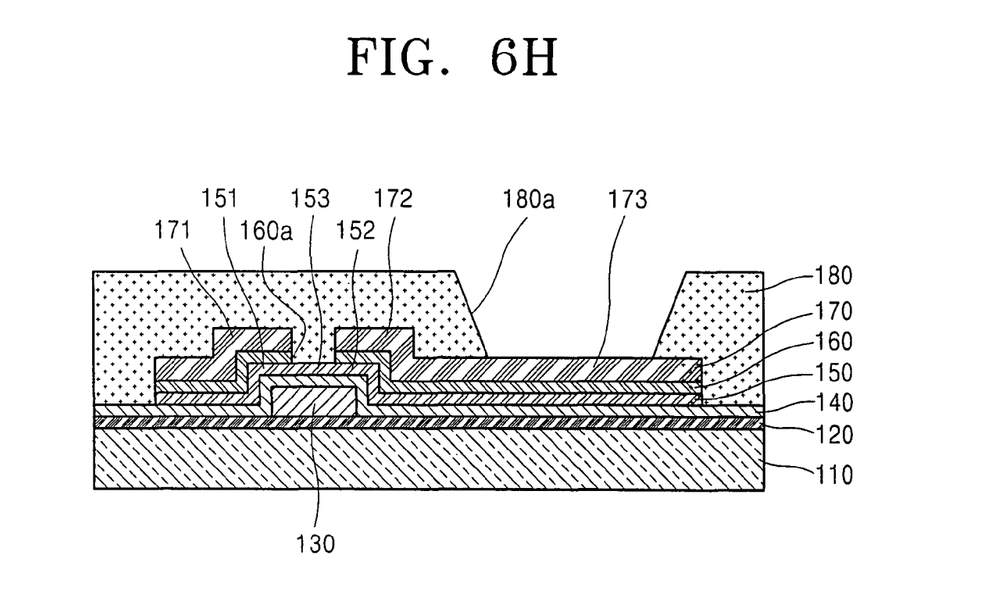

FIG. 6H illustrates an operation of forming the PDL 180 using a third mask (operation S280). Referring to FIG. 6H, the PDL 180 is formed on the source electrode 171, the drain electrode 172, and the pixel electrode 173. In detail, an organic layer formed of an insulating material may be used to form the PDL 180. After the PDL material is stacked, in order to pattern the PDL 180, a photoresist is formed on the PDL material and then, UV light is radiated using the third mask, and thereby an opening 180a which exposes the pixel electrode 173 is formed in a pixel region.

Through the above-described structure, the TFT can be manufactured using only three masks so that a manufacturing process can be simplified and manufacturing costs can be reduced.

According to the present invention, the manufacturing process can be simplified, manufacturing costs can be reduced, and process yield can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat display device comprising:
   a substrate;
   a plurality of TFTs (thin film transistors) provided on the substrate, each TFT comprising a semiconductor active layer, a source electrode and a drain electrode that contact the semiconductor active layer, and an ohmic contact layer interposed between the semiconductor active layer and the source and drain electrodes;
   a light emitting layer deposited on each TFT; and
   a pixel electrode formed by extending one of the source electrode and the drain electrode, wherein the ohmic contact layer and a layer including the source and drain electrodes are formed to have the same pattern, the light emitting layer being in direct contact with the extended one of the source electrode and the drain electrode.

2. The flat display device of claim 1, wherein the pixel electrode is formed by patterning the ohmic contact layer and a source/drain metalic layer including the source and drain electrodes.

3. The flat display device of claim 1, wherein the semiconductor active layer contacts the ohmic contact layer and comprises a crystallized amorphous silicon.

4. The flat display device of claim 1, wherein the semiconductor active layer comprises polycrystalline silicon.

5. The flat display device of claim 1, wherein a portion of the ohmic contact layer formed between the source electrode and the drain electrode is opened so that part of the semiconductor active layer can be exposed to the outside.

6. The flat display device of claim 1, wherein the TFT further comprises a gate electrode formed on the substrate and a gate insulating layer interposed between the gate electrode and semiconductor active layer.

7. The flat display device of claim 6, wherein the gate electrode is formed on the substrate, the gate insulating layer is disposed on the gate electrode, the semiconductor active layer is disposed on the gate insulating layer, the ohmic layer is disposed on the semiconductor active layer and the source electrode and the drain electrode are formed on the ohmic layer.

8. The flat display device of claim 1, further comprising a pixel defining layer which is formed on the TFT and in which an opening for defining a pixel region is formed.

9. A flat display device comprising:
a substrate;
a plurality of thin film transistors provided on the substrate, each thin film transistor comprising a semiconductor active layer, a source electrode and a drain electrode that contact the semiconductor active layer, and an ohmic contact layer interposed between the semiconductor active layer and the source and drain electrodes;
a pixel electrode formed by extending one of the source electrode and the drain electrode; and
a light emitting layer deposited on the pixel electrode, the light emitting layer being in direct contact with the extended one of the source electrode and the drain electrode, wherein the ohmic contact layer and a layer including the source, drain and pixel electrodes having the same pattern.

10. The flat display device of claim 9, wherein the semiconductor active layer contacts the ohmic contact layer and comprises a crystallized amorphous silicon.

11. The flat display device of claim 9, wherein the semiconductor active layer comprises polycrystalline silicon.

12. The flat display device of claim 9, wherein a portion of the ohmic contact layer formed between the source electrode and the drain electrode is opened so that part of the semiconductor active layer can be exposed to the outside.

13. The flat display device of claim 9, wherein the thin film transistor further comprises a gate electrode formed on the substrate and a gate insulating layer interposed between the gate electrode and the semiconductor active layer.

14. The flat display device of claim 13, wherein the gate electrode is formed on the substrate, the gate insulating layer is disposed on the gate electrode, the semiconductor active layer is disposed on the gate insulating layer, the ohmic layer is disposed on the semiconductor active layer and the source electrode and the drain electrode are formed on the ohmic layer.

15. The flat display device of claim 9, further comprising a pixel defining layer which is formed on the thin film transistor and in which an opening for defining a pixel region is formed.

* * * * *